(12) United States Patent
Moon et al.

(10) Patent No.: US 8,269,226 B2
(45) Date of Patent: Sep. 18, 2012

(54) LIGHT EMITTING DEVICE, AND LIGHT EMITTING DEVICE PACKAGE

(75) Inventors: Ji Hyung Moon, Seoul (KR); Sang Youl Lee, Seoul (KR); Chung song Kim, Seoul (KR); Kwang Ki Choi, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/215,397

(22) Filed: Aug. 23, 2011

(65) Prior Publication Data

US 2012/0001222 A1     Jan. 5, 2012

(51) Int. Cl.
*H01L 27/15* (2006.01)
(52) U.S. Cl. .............. 257/81; 257/99; 257/E33.001; 257/E33.062; 438/25; 438/29

(58) Field of Classification Search .............. 257/79, 257/81, 99, 100, 103, E33.001, E33.062; 438/22, 25, 26, 29
See application file for complete search history.

(56) References Cited

U.S. PATENT DOCUMENTS

| 2008/0303411 A1* | 12/2008 | Ohta et al. ............... 313/503 |
| 2009/0294784 A1* | 12/2009 | Nakahara et al. ......... 257/98 |
| 2010/0203661 A1* | 8/2010 | Hodota ..................... 438/29 |

* cited by examiner

*Primary Examiner* — Khiem D Nguyen
(74) *Attorney, Agent, or Firm* — Lowe Hauptman Ham & Berner, LLP

(57) ABSTRACT

A light emitting device including a light emitting structure including a second conductive type semiconductor layer, an active layer, and a first conductive type semiconductor layer, and a first protective layer disposed on a side of the light emitting structure, wherein the first protective layer overlaps with the first conductive type semiconductor layer in a vertical direction.

15 Claims, 12 Drawing Sheets

LIGHT EMITTING DEVICE, AND LIGHT EMITTING DEVICE PACKAGE

CROSS REFERENCE TO RELATED APPLICATION

This application claims the priority of under 35 U.S.C. §119 to Korean Patent Application No. 10-2010-0132552, filed in Korea on 22 Dec. 2010, which is hereby incorporated by reference as if fully set forth herein.

TECHNICAL FIELD

The disclosure relates to a light emitting device, and a light emitting device package.

BACKGROUND

A light emitting diode LED is a kind of semiconductor device which converts electricity to a UV ray or a light by using a characteristic of a compound semiconductor for transmitting/receiving a signal or using as a light source.

A group III-V nitride semiconductor is spot lighted as an essential material of the light emitting diode LED or a laser diode LD owing to its physical and chemical characteristics.

Since the light emitting diode does not contain materials harmful to an environment, such as mercury Hg, used in the present incandescent lamps and fluorescent lamps, the light emitting diode is environment friendly excellently, and replaces the present light sources owing to a long life time, low power consumption, and the like.

SUMMARY

The embodiments are directed to a light emitting device, and a light emitting device package.

The embodiments can improve productivity thereof; and a light emitting device package.

The light emitting device includes a light emitting structure including a second conductive type semiconductor layer, an active layer, and a first conductive type semiconductor layer, and a first protective layer disposed on a side of the light emitting structure, wherein the first protective layer overlaps with the first conductive type semiconductor layer in a vertical direction.

A top side of the first protective layer can be in contact with the first conductive type semiconductor layer. The first protective layer can cover sides of the second conductive type semiconductor layer, and the active layer. The first protective layer can cover a portion of a side of the first conductive type semiconductor layer.

The top side of the first protective layer can be higher than a boundary between the active layer and the first conductive type semiconductor layer and be in contact with the first conductive type semiconductor layer. The top side of the first protective layer can be lower than a top side of the first conductive type semiconductor layer.

The light emitting device can further include a second protective layer which covers sides of the first protective layer and the first conductive type semiconductor layer. The second protective layer can be formed on a top side of the first conductive type semiconductor layer. The first protective layer can include any one of $SiO_2$, $SiO_x$, $SiO_xN_y$, $Si_3N_4$, and $Al_2O_3$. The first protective layer can be in contact with an underside of the second conductive type semiconductor layer.

The light emitting device can further include a second electrode layer disposed under the second conductive type semiconductor layer. And, the light emitting device can further include a first electrode layer disposed on the first conductive type semiconductor layer.

Or, the light emitting device can further include a second electrode layer disposed under the second conductive type semiconductor layer, a first electrode layer passed through the second conductive type semiconductor layer and the active layer and in contact with the first conductive type semiconductor layer, and an insulating layer disposed between the first electrode layer and the second conductive type semiconductor layer, and between the first electrode layer and the active layer. The first electrode layer can be disposed under the second electrode layer and passed through the second electrode layer and the insulating layer is disposed between the first electrode layer and the second electrode layer.

In another aspect of the embodiments, a light emitting device includes a light emitting structure including a second conductive type semiconductor layer, an active layer, and a first conductive type semiconductor layer, and a first protective layer disposed on a side of the light emitting structure, wherein the side of the light emitting structure includes a first portion adjacent to a top surface of the light emitting structure, a second portion adjacent to an underside bottom surface of the light emitting structure and a third portion which connects the first portion to the second portion, wherein the first protective layer covers the second portion.

A step exists between the first portion and the second portion, and the first protective layer is in contact with the third portion.

The light emitting device can further include a second electrode layer disposed under the second conductive type semiconductor layer, and a first electrode layer disposed on the first conductive type semiconductor layer. Or, the light emitting device can further include a second electrode layer disposed under the second conductive type semiconductor layer, a first electrode layer passed through the second conductive type semiconductor layer and the active layer and in contact with the first conductive type semiconductor layer, and an insulating layer disposed between the first electrode layer and the second conductive type semiconductor layer, and between the first electrode layer and the active layer. The first protective layer can be in contact with an underside of the second conductive type semiconductor layer.

In another aspect of the embodiments, a light emitting device package includes a package body, a light emitting device on the package body, a first electrode layer and a second electrode layer mounted on the package body connected to the light emitting device, and a resin layer surrounding the light emitting device, wherein the light emitting device is the embodiment.

It is to be understood that both the foregoing general description and the following detailed description of the present invention are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
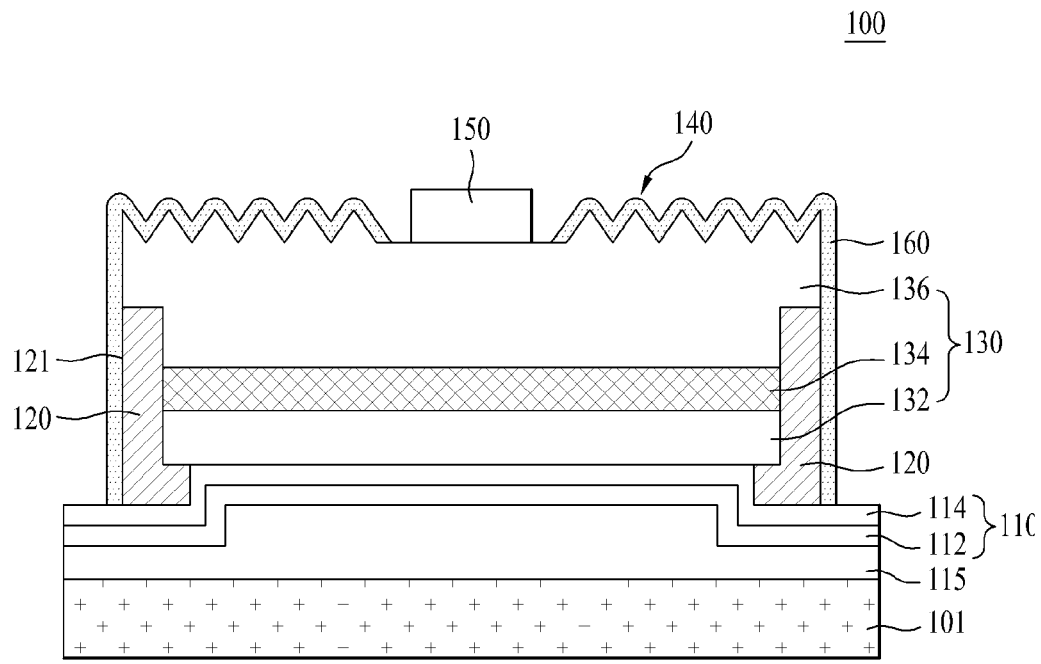
FIG. 1 illustrates a section of a light emitting device in accordance with an embodiment.

Reference will now be made in detail to the specific embodiments of the present invention, examples of which are illustrated in the accompanying drawings. Wherever possible, the same reference numbers will be used throughout the drawings to refer to the same or like parts.

In description of embodiments, if it is described that a layer (a film), a region, a pattern, or a structure is formed "on" or "under" a substrate, a layer (a film), a region, a pad, or a pattern, the "on", or "under" implies that the layer (the film), the region, the pattern, or the structure is formed "on" or "under" the substrate, the layer (the film), the region, the pad, or the pattern directly or indirectly with other substrate, layer (film), region, pad, or pattern, disposed therebetween. And, a reference on the "on" or "under" is the drawing.

A thickness or a size of a layer shown in a drawing can be exaggerated, omitted or shown schematically for convenience or clarity of description. And, a size of an element may not be shown to scale, perfectly.

First Embodiment

FIG. 1 illustrates a section of a light emitting device in accordance with an embodiment.

Referring to FIG. 1, the light emitting device 100 can include a supporting substrate 101, a second electrode layer 110, a first electrode layer 150, a light emitting structure 130, a first protective layer 120, and a second protective layer 160.

The light emitting device 100 can include an LED constructed of a plurality of compound semiconductor layers, for an example, a compound semiconductor of group III-V elements, wherein the LED can be a color LED which can emit a blue, a green or a red color light, or an UV LED. The light from the LED can be produced by using, but not limited to, various semiconductors.

The supporting substrate 101 can be a conductive substrate or an insulating substrate for supporting the light emitting structure 130. The supporting substrate 101 can be formed of metals or semiconductors. For an example, the supporting substrate 101 can be formed of at least one of copper Cu, gold Au, nickel Ni, molybdenum, copper-tungsten Cu—W, a carrier wafer (For an example, Si, Ge, GaAs, ZnO, SiC), and a conductive sheet.

The second electrode layer 110 is formed on the supporting substrate 101. The second electrode layer 110 can have a structure of ohmic layer/reflective layer/bonding layer, or can be a stack of reflective layer (including ohmic)/bonding layer, but not limited to this. For an example, the second electrode layer 110 can have a reflective layer 112 and an ohmic layer 114 stacked on a bonding layer 115 in succession.

The reflective layer 112 can be in contact with an underside of the ohmic layer 114, and formed of a reflective material having reflectivity greater than 50%. The reflective layer 112 can be formed of one selected from a group of materials including Ag, Ni, Al, Rh, Pd, Ir, Ru, Mg, Zn, Pt, Au, and Hf and a selective combination of above materials, or constructed of multiple layers of above metals. The reflective layer 112 can be formed of a light transmissive conductive material of IZO, IZTO, IAZO, IGZO, IGTO, AZO, and ATO. For an example, the reflective layer 112 can be a stack of IZO/Ni, AZO/Ag, IZO/Ag/Ni, or AZO/Ag/Ni. If the reflective layer 112 is formed of a material which makes ohmic contact with the light emitting structure, the ohmic layer 114 may not be formed additionally, but not limited to this.

The ohmic layer 114 can be formed of a light transmissive conductive layer and a metal selectively. For an example, the ohmic layer 114 can be constructed of single or multiple layers of at least one selected from a group of materials including ITO(indium tin oxide), IZO(indium zinc oxide), IZTO(indium zinc tin oxide), IAZO(indium aluminum zinc oxide), IGZO(indium gallium zinc oxide), IGTO(indium gallium tin oxide), AZO(aluminum zinc oxide), ATO(antimony tin oxide), GZO(gallium zinc oxide), $IrO_x$, $RuO_x$, $RuO_x$/ITO, Ni, Ag, Ni/$IrO_x$/Au, and Ni/$IrO_x$/Au/ITO. The ohmic layer 114 is provided for making smooth carrier injection into a second conductive type semiconductor layer 132.

The bonding layer 115 is formed between the supporting substrate 101 and the second electrode layer 110. The bonding layer 115 can include a barrier metal or a bonding metal, for an example, can includes at least one of Ti, Au, Sn, Ni, Cr, Ga, In, Bi, Cu, Ag or Ta. The bonding layer 115 makes strong bonding of the second electrode layer 110 to the supporting substrate 101.

The light emitting structure 130 is formed on the second electrode layer 110. The light emitting structure 130 can be a successive stack of the second conductive type semiconductor layer 132, an active layer 134, and a first conductive type semiconductor layer 136.

The second conductive type semiconductor layer 132 can be formed on the ohmic layer 114 and can be in ohmic contact with an upper side of the ohmic layer 124. The second conductive type semiconductor layer 132 can be formed of a compound semiconductor of group III-V elements doped with second conductive type dopant, for an example, one selected from a group of materials including GaN, AlN, AlGaN, InGaN, InN, InAlGaN, AlInN, AlGaAs, GaP, GaAs, GaAsP, and AlGaInP. The second conductive type dopant can be a p type dopant, such as Mg, and Zn. The second conductive type semiconductor layer 132 can have single or multiple layers, but not limited to this.

The active layer 134 is formed on the second conductive type semiconductor layer 132, and can include any one selected from a double hetero junction structure, a single quantum well structure, a multiple quantum well structure MQW, a quantum point structure, or a quantum line structure. The active layer 134 can be constructed of a well layer and a barrier layer of compound semiconductor materials of group III-V elements, for an example, a paired structure selected from at least one of InGaN/GaN, InGaN/InGaN, GaN/AlGaN, InAlGaN/GaN, GaAs(InGaAs)/AlGaAs, and GaP(InGaP)/AlGaP. The well layer can be formed of a material having a bandgap smaller than the bandgap of the barrier layer.

There can be a conductive type clad layer between the active layer 134 and the first conductive type semiconductor layer 136, or between the active layer 134 and the second conductive type semiconductor layer 132, and the conductive type clad layer can be formed of a semiconductor having a bandgap greater than the bandgap of the barrier layer of the active layer. For an example, the conductive type clad layer can be formed of GaN, AlGaN, InAlGaN, and InAlGaN, or can include a superstructure. The conductive type clad layer can be doped with an n type or a p type dopant.

The first conductive type semiconductor layer 136 is formed on the active layer 134 of a compound semiconductor of group III-V elements doped with first conductive type dopant, for an example, one selected from a group of materials including GaN, AlN, AlGaN, InGaN, InN, InAlGaN, AlInN, AlGaAs, GaP, GaAs, GaAsP, and AlGaInP. The first conductive type dopant can be an n type dopant, such as Si, Ge, Sn, Se, and Te. The first conductive type semiconductor layer 136 can have single or multiple layers, but not limited to this.

The first conductive type semiconductor layer 136 has a top surface having roughness 140 formed thereon for improving light extraction efficiency.

The first electrode layer 150 is formed on the top surface of the first conductive type semiconductor layer 136. The first electrode layer 150 can be formed of metal. For an example, the first electrode layer 150 can be formed of one selected from a group of materials including Ag, Ni, Al, Rh, Pd, Ir, Ru, Mg, Zn, Pt, Au, and Hf and a selective combination of above.

The first protective layer 120 is disposed on a side of the light emitting structure 130. The first protective layer 120 may cover sides of the second conductive type semiconductor layer 132 and the active layer 134 and may overlap with the first conductive type semiconductor layer 136 in a vertical direction partially for protecting the light emitting structure 130, electrically. The first protective layer 120 can be disposed not to project beyond a side of the first conductive type semiconductor layer 136. The first protective layer 120 can cover a side of the first conductive type semiconductor layer 136, partially. The first protective layer 120 can have at least a region vertically overlapped with the second electrode layer 110.

The first protective layer 120 can be formed of an insulating material, or a material having very low electric conductivity, for an example, the first protective layer 120 can be formed of $SiO_2$, $SiO_x$, $SiO_xN_y$, $Si_3N_4$, and $Al_2O_3$. The first protective layer 120 serves to prevent the active layer 134 from contaminating with metal when the light emitting device is separated into unit chips.

Figure 3:
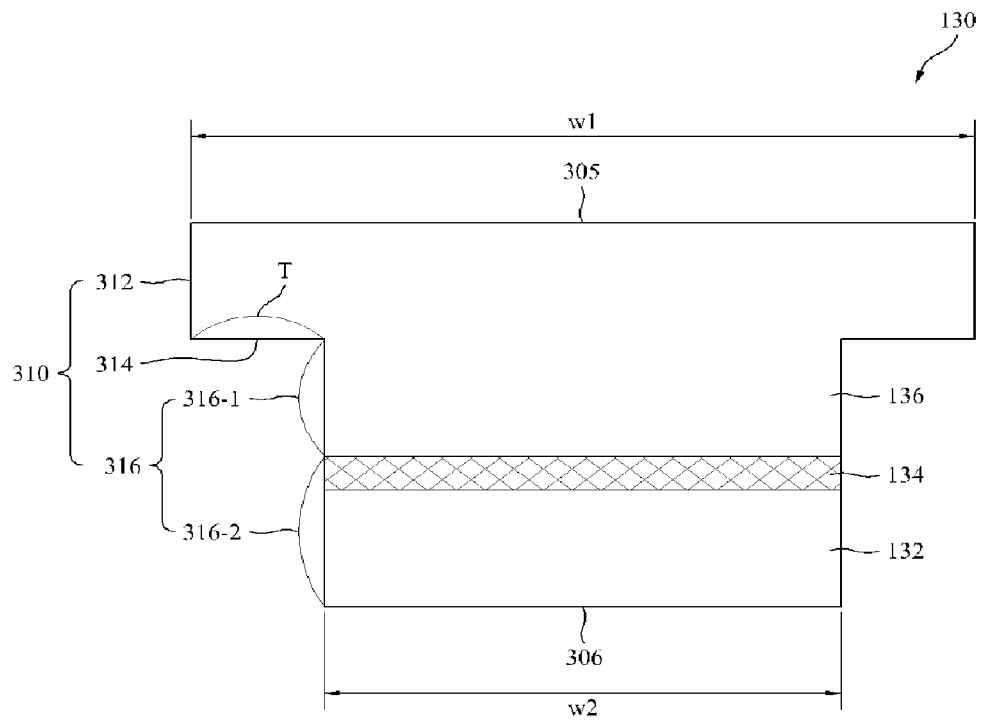
FIG. 3 illustrates a side of the light emitting structure in FIG. 1.

The light emitting structure 130 can have a plurality of sides. FIG. 3 illustrates a side 310 of the light emitting structure 130 in FIG. 1. The roughness formed on the top side of the first conductive type semiconductor layer 136 is omitted from FIG. 3.

The side 310 of the light emitting structure 130 can have sides of the first conductive type semiconductor layer 136, the active layer 134, and the second conductive type semiconductor layer 132.

The side 310 of the light emitting structure 130 can have a first portion 312, a second portion 316, and a third portion 314. The first portion 312 and the second portion 316 can have a step to each other. The third portion 314 can be disposed between the first portion and the second portion and can be connected with the first portion 312 and the second portion 316.

The first portion 312 can be adjacent to the top surface 305 of the light emitting structure 130. The second portion 316 can be adjacent to an under side 306 of the light emitting structure 130. The third portion 314 connects the first portion 312 to the third portion 316, and can be parallel to the top surface 305 of the light emitting structure 130. There can be the step T between the first portion 312 and the second portion 316. For an example, the step T between the first portion 312 and the second portion 316 can be horizontal in a direction from the first portion to the second portion, or vertical to the first portion (or second portion). Owing to the step T, a width w1 of the light emitting structure 130 surrounded by the first portion 312 can be greater than a width w2 of the light emitting structure 130 surrounded by the second portion 316.

The first portion 312, the third portion 314, and a portion 316-1 of the second portion 316 of the light emitting structure 130 can be a side of the first conductive type semiconductor layer 136. And, the other portion 316-2 of the second portion 316 of the light emitting structure 130 can be the sides of the active layer 134 and the second conductive type semiconductor layer 132.

Referring to FIGS. 1 and 3, the first protective layer 120 covers the second portion 316 of the light emitting structure 130. Moreover, the first protective layer 120 can cover the third portion 314 of the light emitting structure 130. The first protective layer 120 can be in contact with the third portion 314. The first protective layer 120 can have an outside 121 which can be flush with the first portion 312 of the light emitting structure 130, but not limited to this.

The first protective layer 120 can be in contact with the underside bottom surface 306 of the light emitting structure 130. For an example, the first protective layer 120 can cover an edge region of the underside bottom surface 306 adjacent to the second portion 316.

The second protective layer 160 is disposed on sides of the first protective layer 120 and the first conductive type semiconductor layer 136. For an example, the second protective layer 160 can be disposed on the outside 121 of the first protective layer 120 and the first portion 312 of the light emitting structure 130.

The second protective layer 160 can also be disposed on the top side of the first conductive type semiconductor layer 136, but not limited to this. The second protective layer 160 is formed of an insulating material for protecting the light emitting structure 130, electrically. The second protective layer 160 can be formed of $SiO_2$, $SiO_x$, $SiO_xN_y$, $Si_3N_4$, and $Al_2O_3$, but not limited to.

FIGS. 2A~2L illustrate sections showing the steps of a method for fabricating the light emitting device in FIG. 1.

Figure 2A:
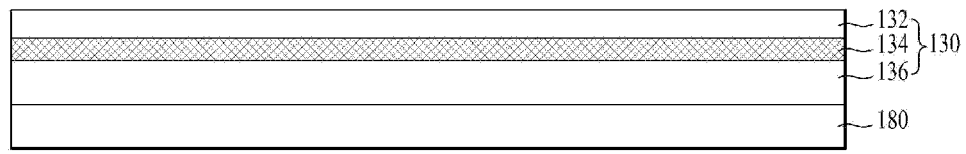
FIGS. 2A~2L illustrate sections of light emitting devices showing the steps of a method for fabricating the light emitting device in FIG. 1.

Referring to FIG. 2A, a light emitting structure 130 is grown on a growth substrate 180. The growth substrate 180 can be a semiconductor wafer. For an example, the growth substrate 180 can be formed of at least one selected from, but not limited to, sapphire $Al_2O_3$, SiC, GaAs, GaN, ZnO, Si, GaP, InP, and Ge.

The light emitting structure 130 can be formed by growing a first conductive type semiconductor layer 136, an active layer 134, and a second conductive type semiconductor layer 132 on the growth substrate 180 in succession.

For an example, the light emitting structure 130 can be formed by MOCVD(Metal Organic Chemical Vapor Deposition), CVD(Chemical Vapor Deposition), PECVD(Plasma-Enhanced Chemical Vapor Deposition), MBE(Molecular Beam Epitaxy), HVPE(Hydride Vapor Phase Epitaxy) and the like.

A buffer layer (not shown) and/or an undoped nitride layer (not shown) can also be formed between the light emitting structure 130 and the growth substrate 180 for moderating a difference of lattice constants.

Figure 2B:
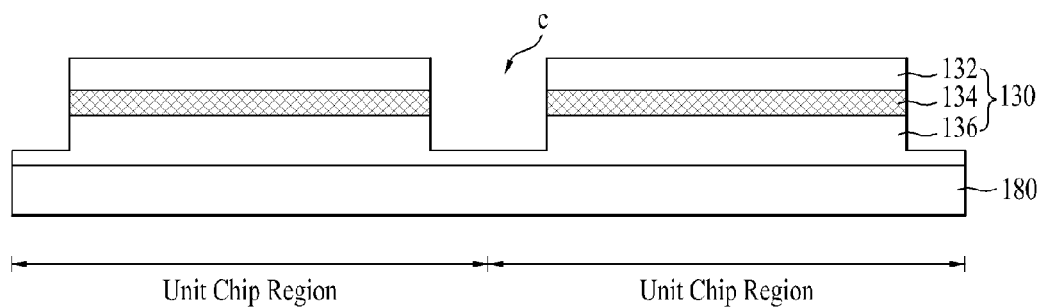

Next, referring to FIG. 2B, the second conductive type semiconductor layer 132 and the active layer 134 are removed from a boundary of unit chips to expose a side of the active layer 134, to form a plurality of channels C which are spaces. A portion of the first conductive type semiconductor layer 136 can be removed.

Figure 2C:
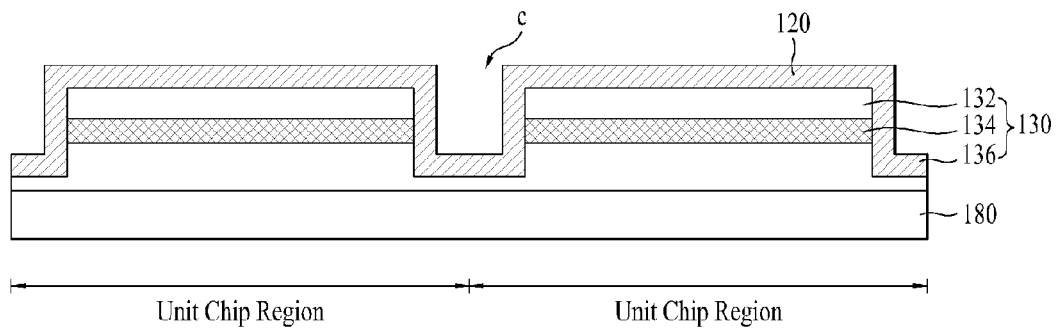

Next, referring to FIG. 2C, a first protective layer 120 is formed on the removed portion.

Figure 2D:
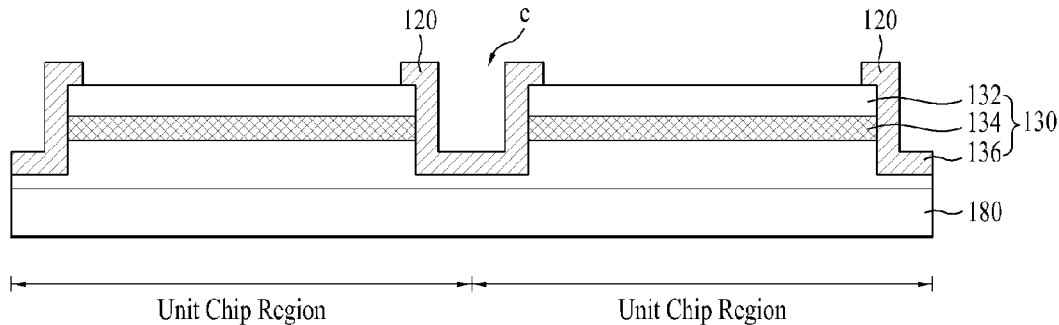

Next, referring to FIG. 2D, the first protective layer 120 is removed from an upper side of the second conductive type semiconductor layer 132 leaving the first protective layer 120 at the channel C portion.

Figure 2E:
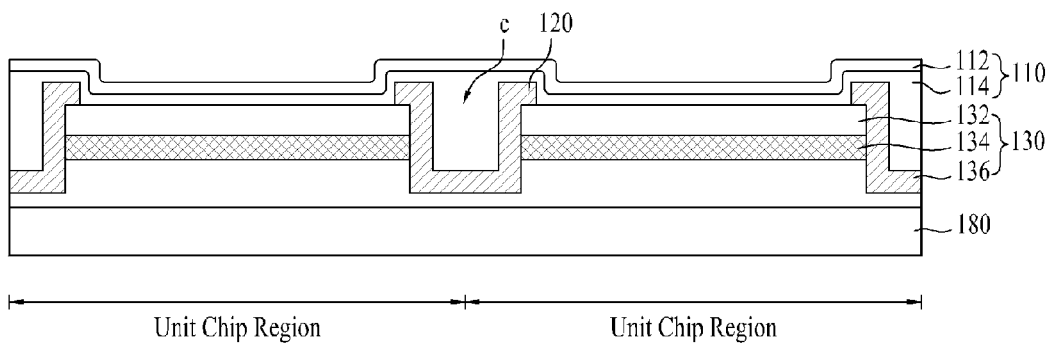

Next, referring to FIG. 2E, an ohmic layer 114 and a reflective layer 112 of a second electrode layer 110 are formed on the second conductive type semiconductor layer 132 and the first protective layer 120, in succession. Though the ohmic layer 114 and the reflective layer 112 are formed to include the channel C portion, the ohmic layer 114 and the reflective layer 112 may not be formed at the channel C portion.

Figure 2F:
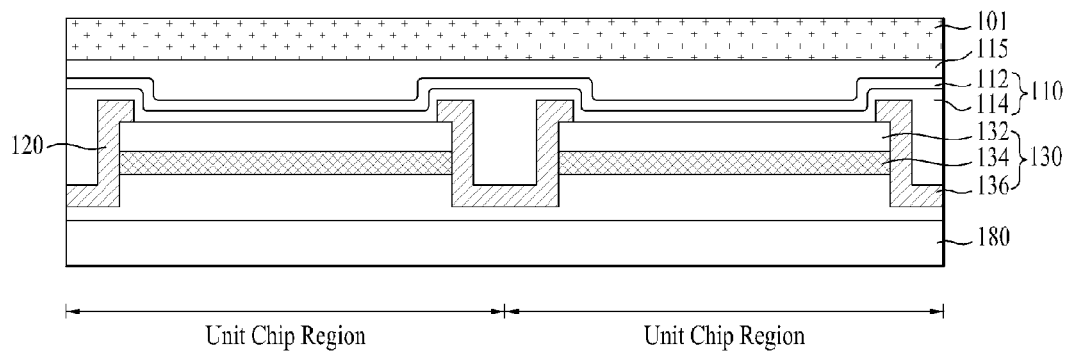

Next, referring to FIG. 2F, a bonding layer 115 is formed on the reflective layer 112, and a supporting substrate 101 is formed on the bonding layer 115. The supporting substrate 101 can be formed by bonding, plating, or deposition. The supporting substrate 101 can be formed on the reflective layer 112 directly without the bonding layer 115.

Figure 2G:
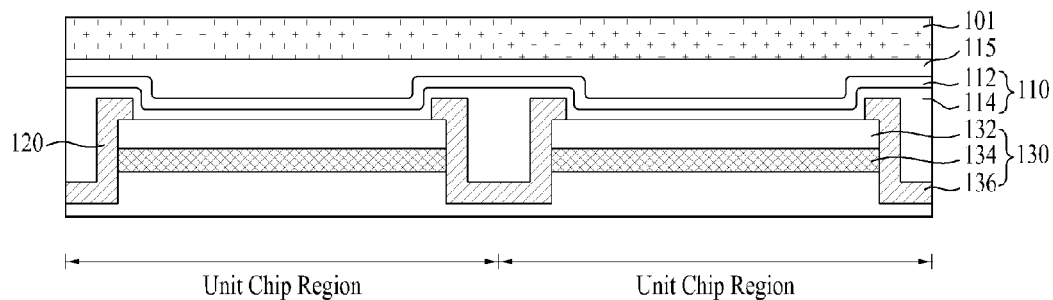

Next, referring to FIG. 2G, the growth substrate 180 is removed from the light emitting structure 130 by using Laser Lift Off or Chemical Lift Off.

Figure 2H:
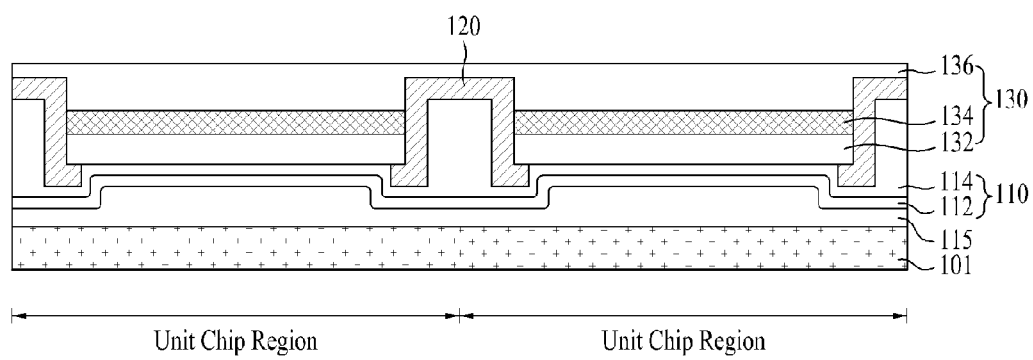

Next, referring to FIG. 2H, the structure having the growth substrate 180 removed therefrom is upside down.

Figure 2I:
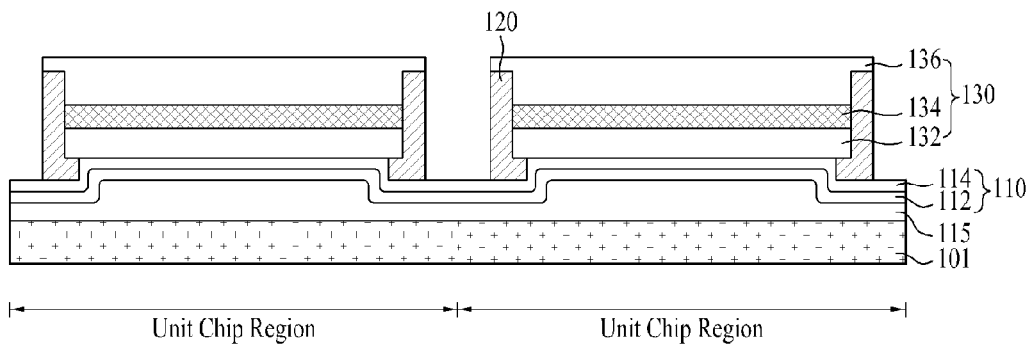

Next, referring to FIG. 2I, the light emitting structure 130 is subjected to isolation etching along unit chip regions, to separate the light emitting structure 130 to expose the second electrode layer 114, partially. The isolation etching is performed at an adequate distance from the active layer 134 for preventing the active layer 134 from exposing, but protected by the protective layer 120, adequately. The first protective layer 120 prevents the active layer 134 from contaminating with metal from the second electrode layer 114 in the isolation etching. For an example, the isolation etching can be made by dry etching, like ICP (Inductively Coupled Plasma).

The first protective layer 120 prevents metallic materials included in the second electrode layer 114 from sticking to the active layer 134 in the isolation etching.

If there is no first protective layer 120, the first the metallic materials included in the second electrode layer 114 may be stick to the active layer 134, and this can cause short between the second electrode layer 110 and the first electrode layer 150 (See FIG. 2J) in the isolation etching. It is required to abandon the light emitting device if the active layer is contaminated with the metallic materials. This causes poor productivity. Since the embodiment prevents the active layer 134 from being contaminated with the metallic materials in the isolation etching basically, the embodiment can improve the productivity.

Figure 2J:
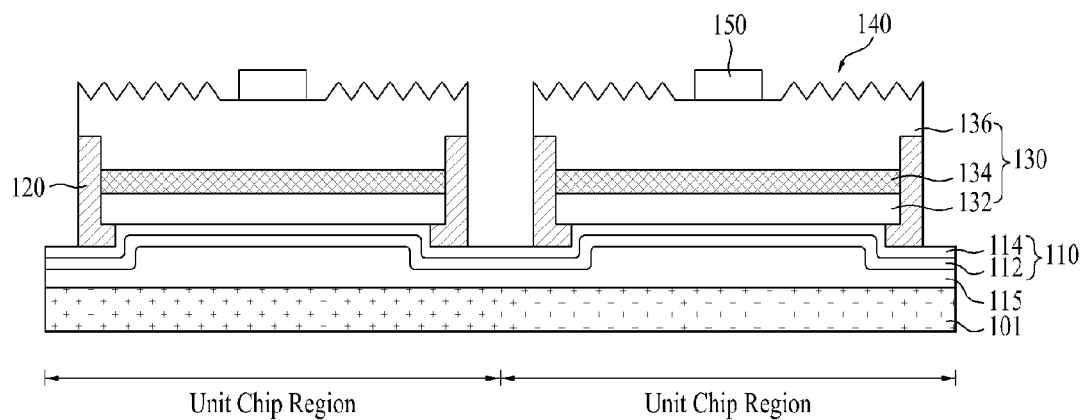

Next, referring to FIG. 2J, a roughness 140 is formed on a top side of the first conductive type semiconductor layer 136. And, a first electrode layer 150 is formed on the first conductive type semiconductor layer 136.

Figure 2K:
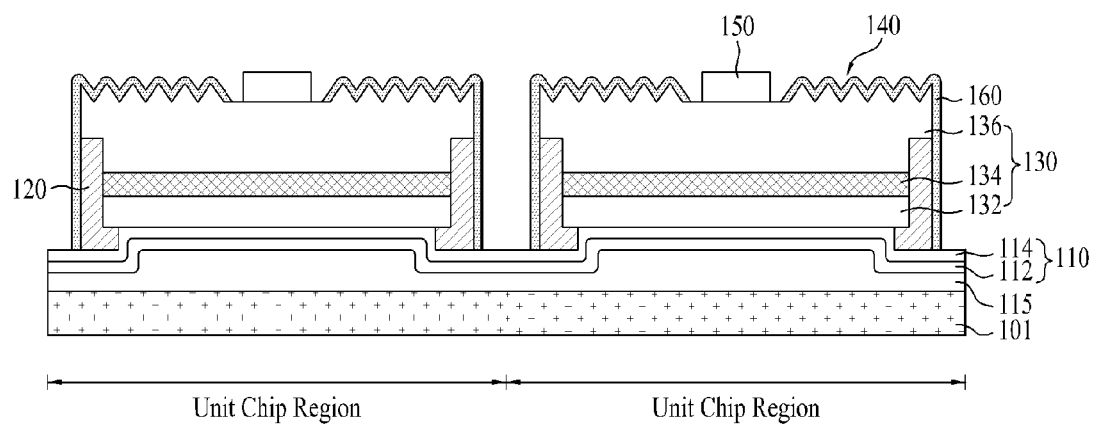

Then, referring to FIG. 2K, a second protective layer 160 is formed to cover a side of the light emitting structure 130, i.e., sides of the first conductive type semiconductor layer 136 and the first protective layer 120. The second protective layer 160 can cover the top side of the first conductive type semiconductor layer 136.

Figure 2L:
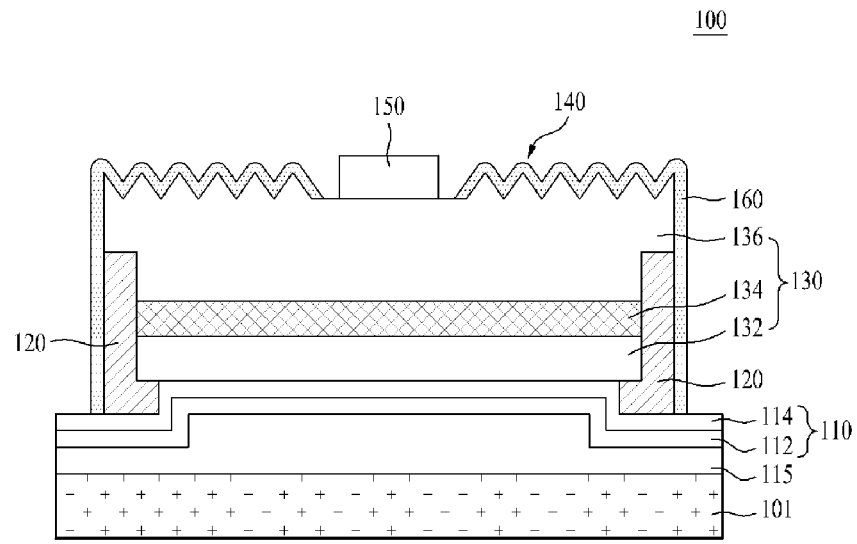

Then, referring to FIG. 2L, the structure is cut into unit chips by a chip cutting process. For an example, the chip cutting process can be one of breaking process, laser scribing process, and etching process, but limited to this. Physical force is applied with a blade to separate the chips in breaking process. A laser beam is directed to a boundary of the chips to separate the chips in laser scribing process. The etching process can be wet etching or dry etching.

In the foregoing method for fabricating a light emitting device, an order of the steps are not limited, but another step can be added between adjacent steps or omitted from adjacent steps.

Second Embodiment

Figure 4:
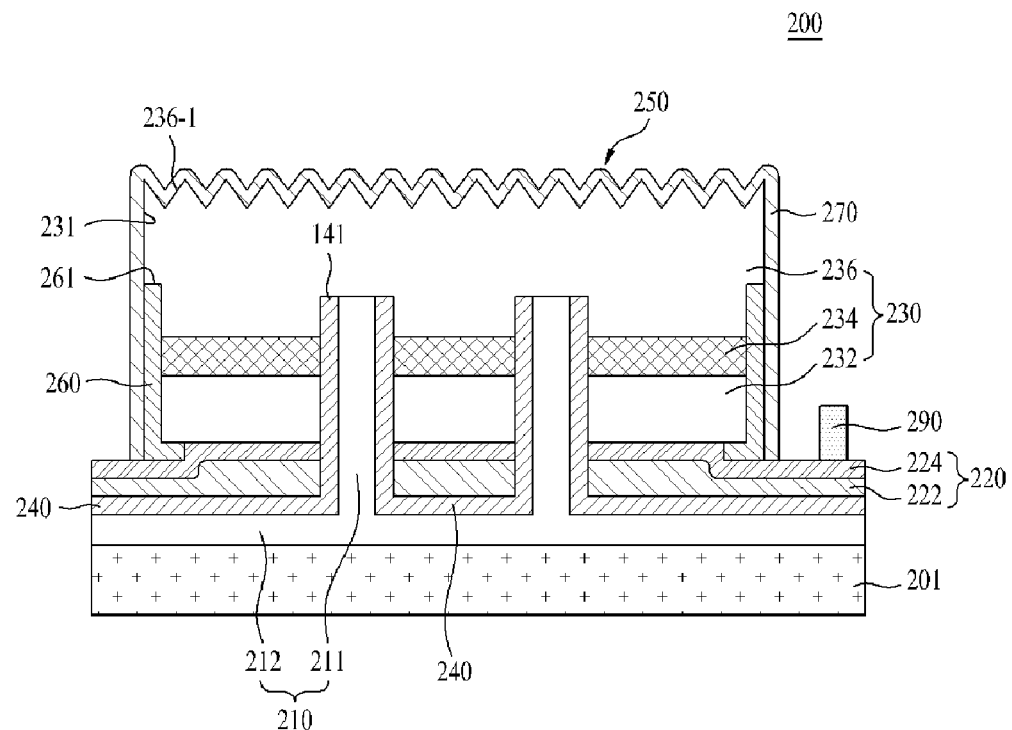
FIG. 4 illustrates a section of a light emitting device in accordance with another embodiment.

FIG. 4 illustrates a section of a light emitting device 200 in accordance with an embodiment.

Referring to FIG. 4, the light emitting device 200 can include a supporting substrate 201, a first electrode layer 210, a second electrode layer 220, a light emitting structure 230, an insulating layer 240, a first protective layer 260, and a second protective layer 270.

Since the supporting substrate 201 and the light emitting structure 230 are similar to the supporting substrate 101 and the light emitting structure 130 in FIG. 1 substantially, detailed description thereof will be omitted.

The first electrode layer 210 is formed on the supporting substrate 201. For an example, the first electrode layer 210 can be formed of metal, for an example, one selected from a group of materials including Ag, Ni, Al, Rh Pd, Ir, Ru, Mg, Zn, Pt, Au, and Hf and a selective combination thereof. And, the first electrode layer 210 can be constructed of single or multiple layers of reflective electrode materials each having an ohmic characteristic. For an example, the first electrode layer 210 can be formed of materials including above metals and at least one of ITO(indium tin oxide), IZO(indium zinc oxide), IZTO(indium zinc tin oxide), IAZO(indium aluminum zinc oxide), IGZO(indium gallium zinc oxide), IGTO (indium gallium tin oxide), AZO(aluminum zinc oxide), ATO (antimony tin oxide), GZO(gallium zinc oxide), IrOx, RuOx, RuOx/ITO, Ni/IrOx/Au, and Ni/IrOx/Au/ITO. If the first electrode layer 210 has an ohmic function, no ohmic layer can be formed.

The second electrode layer 220 is formed on the first electrode layer 210, and the insulating layer 240 is formed between the second electrode layer 220 and the first electrode layer 210 for insulating the first electrode layer 210 from the second electrode layer 220.

The second electrode layer 220 can have a structure of ohmic layer/reflective layer/bonding layer, or can be a stack of reflective layer (including ohmic)/bonding layer, but not limited to this. For an example, the second electrode layer 220 can have a reflective layer 222 and the ohmic layer 224 stacked on the insulating layer 240 in succession. Since the reflective layer 222 and the ohmic layer 224 are similar to reflective layer 112 and the ohmic layer 114 in FIG. 1 substantially, detailed description thereof will be omitted.

The light emitting structure 230 is formed on the second electrode layer 220. The light emitting structure 230 can be a successive stack of a second conductive type semiconductor layer 232, an active layer 234, and a first conductive type semiconductor layer 236. A roughness 250 can be formed on a top side of the first conductive type semiconductor layer 236 for improving light extraction efficiency. The roughness can be regular or irregular.

The first electrode layer 210 is in contact with the first conductive type semiconductor layer 236 passed through the second electrode layer 220, the second conductive type semiconductor layer 232, and the active layer 234 in a vertical direction. And, the insulting layer 240 can be disposed between a passed through portion of the second electrode layer 220 and the first electrode layer 210, between a passed through portion of the second conductive type semiconductor layer 232 and the first electrode layer 210, and between a passed through portion of the active layer 234 and the first electrode layer 210.

The first electrode layer 210 can have a lower electrode layer 212 in contact with the supporting substrate 201 and at least one contact electrode 211 which is a vertical branch from the lower electrode layer 212 in contact with the first conductive type semiconductor layer 236, electrically.

At least the one contact electrode 211 can be the vertical branch from the lower electrode layer 212 in contact with the first conductive type semiconductor layer 236 passed through the second electrode layer 220, the second conductive type semiconductor layer 232, and the active layer 234, electrically. At least the one contact electrode 213 can have a top side positioned higher than the active layer 234 and lower than the top side of the first conductive type semiconductor layer 236. That is, a portion of the top side of the contact electrode 211 can be disposed in the first conductive type semiconductor layer 236. The vertical direction is a direction the first electrode layer 210 faces the first conductive type semiconductor layer 236.

The contact electrode 211 of the first electrode layer 210 can be plural spaced from one another for making smooth supply of a current to the first conductive type semiconductor layer 236. The contact electrode 211 can have at least one of patterns selected from a radial pattern, a cross pattern, a line pattern, a curve pattern, a loop pattern, a hook pattern, and a ring pattern, but not limited to this.

The insulating layer 240 insulates the first electrode layer 210 from other layers 220, 232, and 234.

The insulating layer 240 can be positioned between the first electrode layer 210 and the second electrode layer 220 for insulating the first electrode layer 210 from the second electrode layer 220, electrically.

The insulating layer 240 is disposed between the first electrode layer 210 and the reflective layer 222. The insulating layer 240 is disposed between the lower electrode layer 213 and the reflective layer 222 for insulating the lower electrode layer 212 from the reflective layer 222.

The insulating layer 240 is formed around the contact electrode 211 for preventing short from taking place between the first electrode layer 210 and other layers 220, 233, and 234, electrically. For an example, a portion 141 of the insulating layer 240 can be disposed between a side of the contact electrode 211 and the second electrode layer 210, between the side of the contact electrode 211 and the second conductive type semiconductor layer 232, and between the side of the contact electrode 211 and the active layer 234 for insulating the contact electrode 211 from other layers 220, 232, and 234. Moreover, the insulating layer 240 can be disposed between the side of the contact electrode 211 and the first conductive type semiconductor layer 136, too.

The insulating layer 240 can be formed of $SiO_2$, $SiO_x$, $SiO_xN_y$, $Si_3N_4$, and $Al_2O_3$, but not limited to this.

The first protective layer 260 is disposed on a side of the light emitting structure 230. The first protective layer 260 covers sides of the second conductive type semiconductor layer 232 and the active layer 234 for protecting the light emitting structure 230, electrically. The first protective layer 260 can cover a portion of a side of the first conductive type semiconductor layer 236.

The first protective layer 260 has a portion overlapped with the first conductive type semiconductor layer 236 in a vertical direction, and the first conductive type semiconductor layer 236 has a side line projected beyond a side line of the first protective layer 260.

The first protective layer 260 can have a structure in which the first protective layer 260 is extended into a side of the light emitting structure 230 at portions of the second conductive type semiconductor layer 232, the active layer 234, and the first conductive type semiconductor layer 236.

For an example, a side of the second conductive type semiconductor layer 232, a side of the active layer 234, and a portion of a side of the first conductive type semiconductor layer 236 have grooves in the light emitting structure 230, and the first protective layer 260 is placed in the grooves.

The first protective layer 260 can have a top side 261 higher than a boundary between the active layer 234 and the first conductive type semiconductor layer 236. And, the top side 261 of the first protective layer 260 can be lower than a top side 236-1 of the first conductive type semiconductor layer 236.

The first conductive type semiconductor layer 236 can have a portion positioned higher than the top side 261 of the first protective layer 260, and the top side 261 can be in contact with the first conductive type semiconductor layer 236. A portion of the first conductive type semiconductor layer 236 in contact with the top side 261 of the first protective layer 260 may not be vertically overlapped with the active layer 234 and the second conductive type semiconductor layer 232.

At least a portion of the first protective layer 260 vertically can overlap with the second electrode layer 220. The first protective layer 260 can be in contact with a side of the ohmic layer 224 or/and the reflective layer 222, and cover the side of the ohmic layer 224 or/and the reflective layer 222. The first protective layer 260 can be extended in the side of the ohmic layer 224 or/and the reflective layer 222.

The first protective layer 260 can be formed of an insulating material or a material having very low electric conductivity, for an example, $SiO_2$, $SiO_x$, $SiO_xN_y$, $Si_3N_4$, and $Al_2O_3$, but not limited to this. The first protective layer 260 prevents the active layer 234 from contaminating with metal when the light emitting structure is separated into unit chips.

As described with reference to FIG. 3, the side of the light emitting structure 230 in FIG. 4 can include a first portion 312, a second portion 316, and a third portion 314. And, as described with reference to FIG. 3, the first protective layer 260 can cover the second portion 316 and the third portion 314.

The second protective layer 270 is disposed on a side of the first protective layer 260 and the first conductive type semiconductor layer 236. The second protective layer 270 can be formed on the top side of the first conductive type semiconductor layer 236. The second protective layer 270 is formed of an insulating material for protecting the light emitting structure 230 electrically. The second protective layer 270 can be formed of a material identical to the first protective layer, for an example, $SiO_2$, $SiO_x$, $SiO_xN_y$, $Si_3N_4$, and $Al_2O_3$, but not limited to this.

One side of the second electrode layer 220, for an example one side of the ohmic layer 224 and/or the reflective layer 222 can be opened, and a first electrode pad 290 can be disposed on the opened one side. The first electrode pad 290 can have a shape of an electrode.

FIGS. 5A~5J illustrate sections showing the steps of a method for fabricating the light emitting device in FIG. 4 in accordance with an embodiment.

Figure 5A:
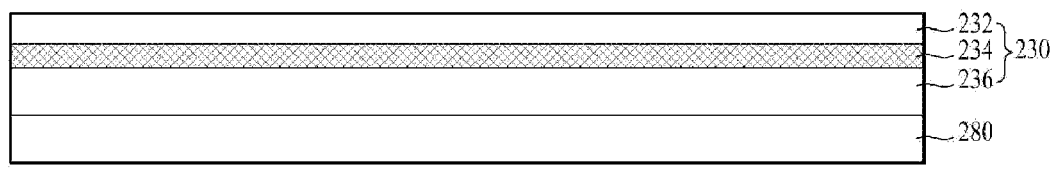
FIGS. 5A~5J illustrate sections of light emitting devices showing the steps of a method for fabricating the light emitting device in FIG. 4 in accordance with another embodiment.

Referring to FIG. 5A, a light emitting structure 230 is grown on a growth substrate 280. The growth substrate 280 can be formed of at least one selected from, but not limited to, sapphire $Al_2O_3$, SiC, GaAs, GaN, ZnO, Si, GaP, InP, and Ge. The light emitting structure 230 can be formed by growing a first conductive type semiconductor layer 236, an active layer 234, and a second conductive type semiconductor layer 232 on the growth substrate 230 in succession.

Figure 5B:
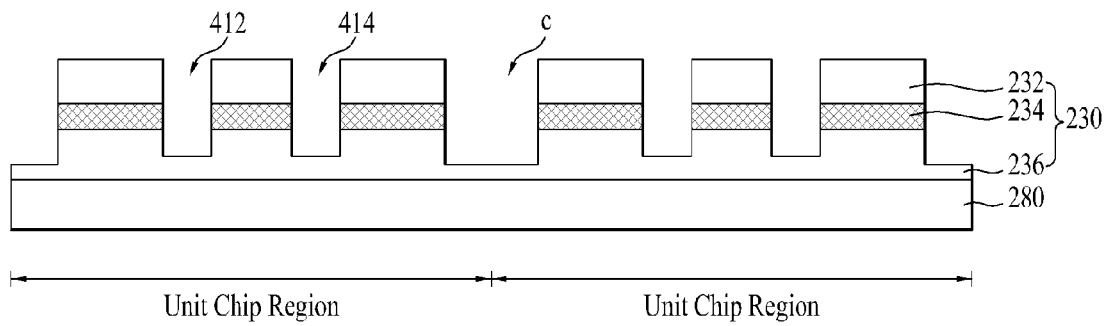

Next, referring to FIG. 5B, the second conductive type semiconductor layer 232 and the active layer 234 are removed to expose a side of the active layer 234, to form a plurality of channels C which are spaces at boundaries of unit chips. A portion of the first conductive type semiconductor layer 236 can also be removed.

And, at the same time with formation of the channels C, at least one hole 412 and 414 is formed in a unit chip region which exposes the first conductive type semiconductor layer 236 passed through the second conductive type semiconductor layer 232 and the active layer 234. To do this, photolithography and etching can be used.

Figure 5C:
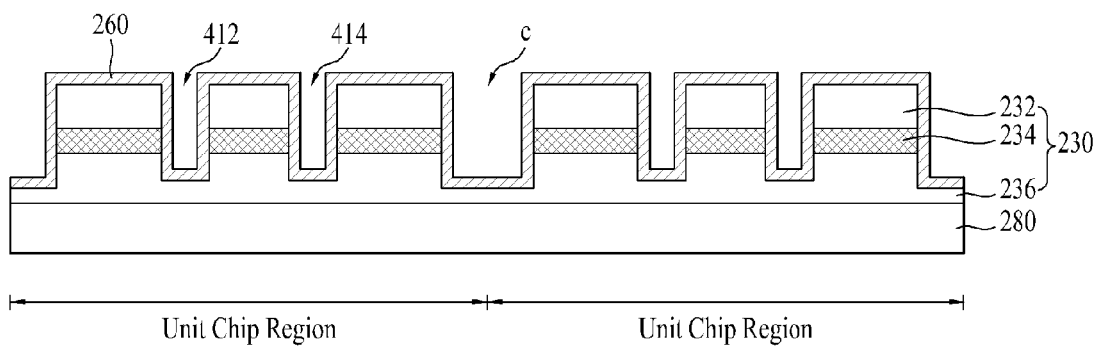

Next, referring to FIG. 5C, a first protective layer 260 is formed on the removed portion.

Figure 5D:
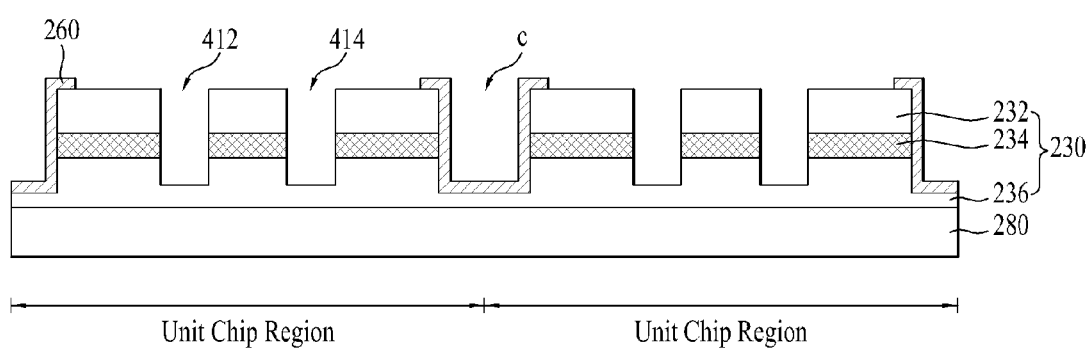

Next, referring to FIG. 5D, the first protective layer 260 is removed from an upper side of the second conductive type semiconductor layer 232 leaving the first protective layer 260 at the channel C portion.

Figure 5E:
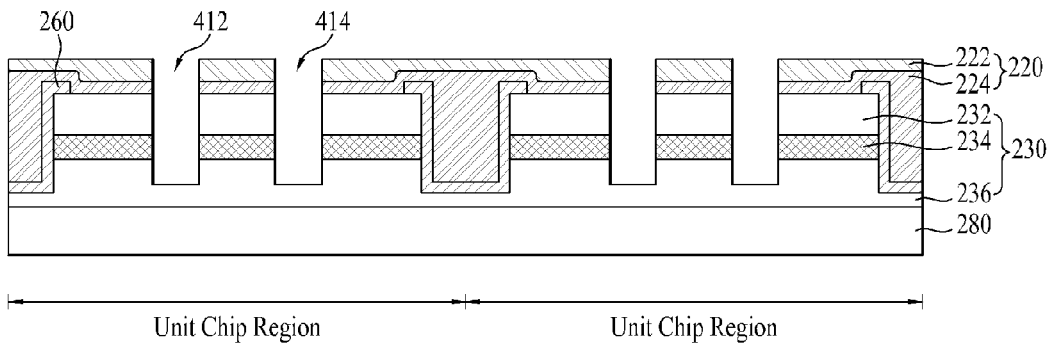

Next, referring to FIG. 5E, an ohmic layer 224 and a reflective layer 222 of a second electrode layer 220 are formed on the second conductive type semiconductor layer 232 and the first protective layer 260, in succession. To do this, the hole 412 and 414 is filled with photoresist, and after the ohmic layer 224 and the reflective layer 222 are formed, the photoresist is removed. Though the ohmic layer 224 and the reflective layer 222 are formed to include the channel C portion, the ohmic layer 224 and the reflective layer 222 may not be formed at the channel C portion.

Figure 5F:
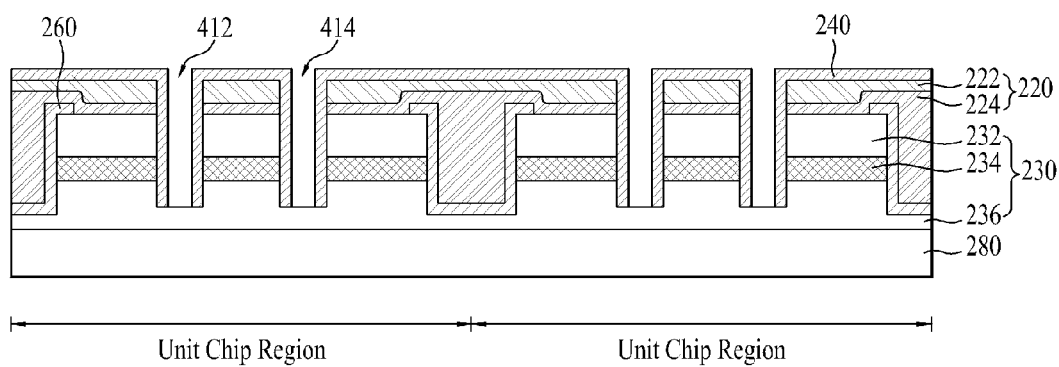

Next, referring to FIG. 5F, an insulating layer 240 is formed at a side of the holes 412 and 414 and on the second electrode layer 220. The insulating layer 240 is not formed on a bottom of the holes 412 and 414.

Figure 5G:
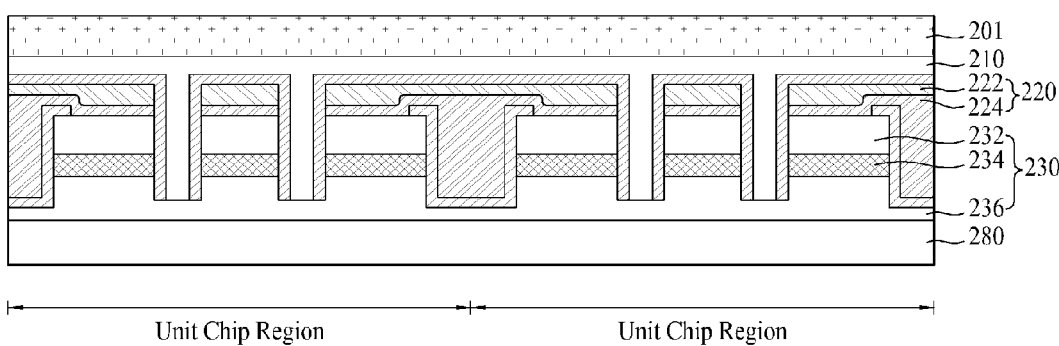

Next, referring to FIG. 5G, the holes 412 and 414 is filled with a conductive material to form a first electrode layer 210 on the insulating layer 240 to be in contact with the first conductive type semiconductor layer 236. A portion of the first electrode layer 210 filled in the holes 412 and 414 to be in contact with the first conductive type semiconductor layer 236 becomes a contact electrode 211 (See FIG. 3). Then, a supporting substrate 201 is formed on the first electrode layer 210. The supporting substrate 201 can be formed by bonding, plating, or deposition.

Figure 5H:
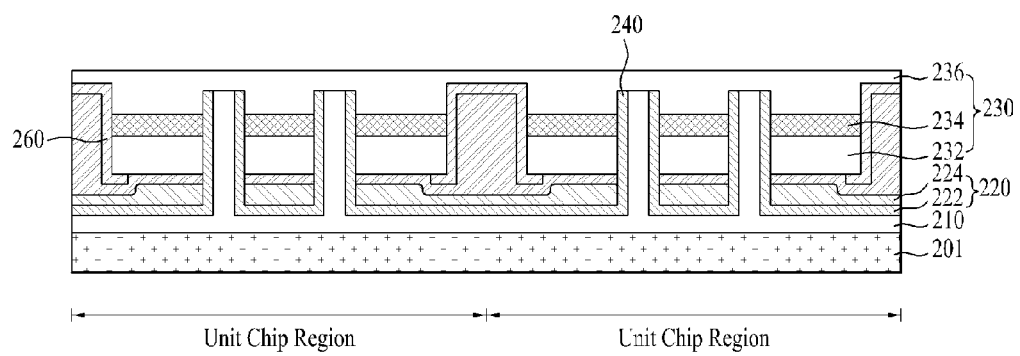

Next, referring to FIG. 5H, the growth substrate 280 is removed from the light emitting structure 230 by using Laser Lift Off or Chemical Lift Off. FIG. 5H illustrates the structure in FIG. 5G upside down.

Figure 5I:
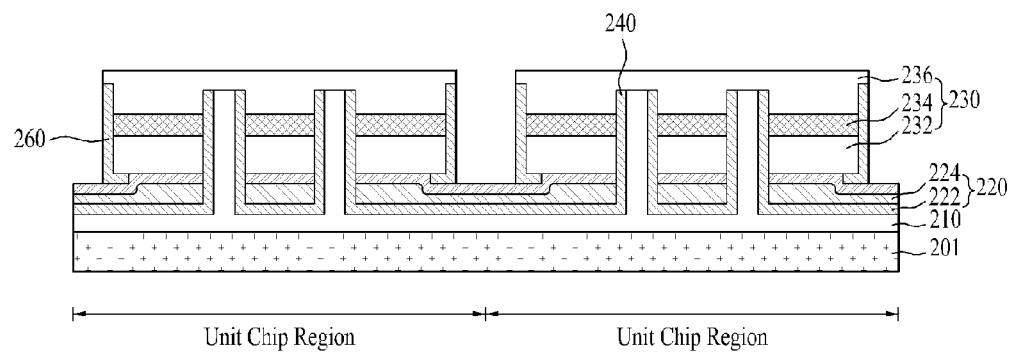

Next, referring to FIG. 5I, the light emitting structure 230 is subjected to isolation etching along unit chip regions to separate the light emitting structure 230 to expose the second electrode layer 214, partially. The isolation etching is performed at an adequate distance from the active layer 234 for preventing the active layer 234 from exposing, but protected by the protective layer 260, adequately. For an example, the isolation etching can be made by dry etching, like ICP (Inductively Coupled Plasma).

The first protective layer 260 prevents the metal included in the second electrode layer 220 from sticking to the active layer 234 in the isolation etching. If no first protective layer 260 is formed, the metal included in the second electrode layer 220 sticks to the active layer 234, to cause short between the second electrode layer 220 and the first electrode layer 210 in the isolation etching. Since it is required to abandon the light emitting device if the active layer 234 is contaminated with the metal in the isolation etching, this causes poor productivity. Since the embodiment prevents the active layer 234 from contaminating with the metal in the isolation etching basically, the embodiment can improve the productivity.

Figure 5J:
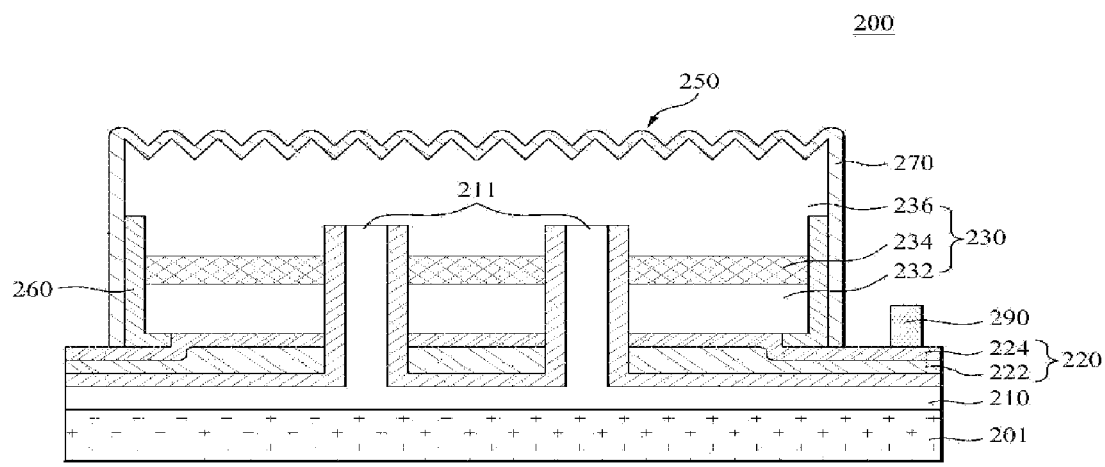

Next, referring to FIG. 5J, a roughness 250 is formed on a top side of the first conductive type semiconductor layer 236. And, a second protective layer 270 is formed to cover a side of the light emitting structure 230, i.e., sides of the first conductive type semiconductor layer 236 and the first protective layer 260. The second protective layer 270 can cover the top side of the first conductive type semiconductor layer 236. Then, the structure is cut into unit chips by a chip cutting process. The chip cutting process can be, for an example, breaking process, laser scribing process, or etching process including wet etching or dry etching, but not limited to.

In the foregoing method for fabricating a light emitting device, an order of the steps are not limited, but another step can be added between adjacent steps or omitted from adjacent steps.

Figure 6:
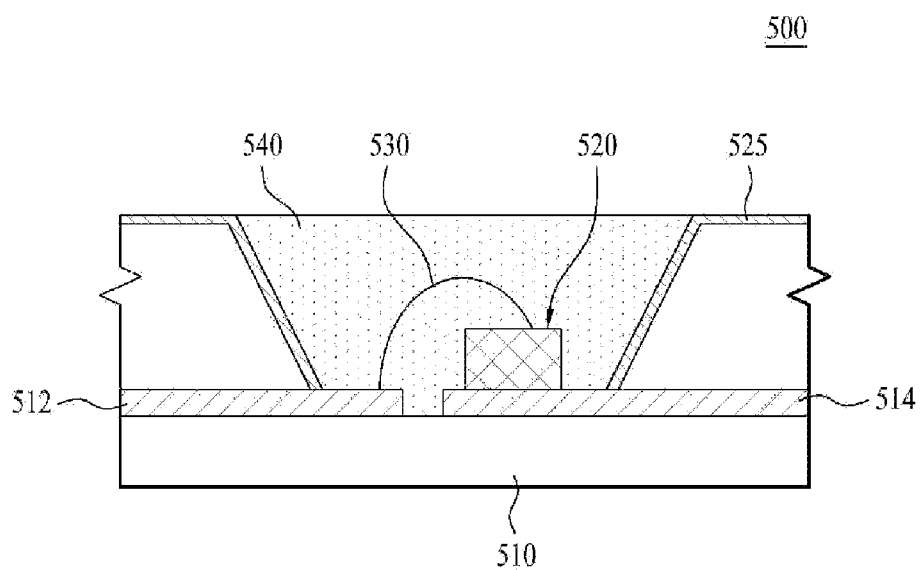
FIG. 6 illustrates a section of a light emitting device package in accordance with an embodiment.

FIG. 6 illustrates a section of a light emitting device package in accordance with an embodiment.

Referring to FIG. 6, the light emitting device package 500 includes a package body 510, lead frames 512 and 514, a light emitting device 520, a reflective plate 525, a wire 530, and a resin layer 540.

The package body 510 can have a cavity formed in a top side thereof. The cavity can have sloped side walls. The package body 510 can be constructed of a substrate having good insulating property or thermal conductivity, such as a silicon based wafer level package, a silicon substrate, silicon carbide SiC, and aluminum nitride AlN, and can have a structure in which a plurality of substrates are stacked. The embodiment does not limit a material, a structure and a shape of the body 510 described above.

The lead frames 512 and 514 are mounted to the package body 510 so as to be separated electrically from the light emitting device taking heat dissipation and mounting of the light emitting device into account. The light emitting device 520 is connected to the lead frames 512 and 514, electrically. The light emitting device 520 can be any one of the light emitting devices in one of the embodiments described with reference to FIGS. 1 and 4.

The reflective plate 525 can be formed on the side wall of the cavity of the package body 510 such that a light from the light emitting device is directed toward a predetermined direction. The reflective plate 525 is formed of a light reflective material, for an example, can be a metal coating, or a metal foil.

The resin layer 540 surrounds the light emitting device 520 positioned in the cavity of the package body 510 for protecting the light emitting device 520 from an external environment. The resin layer 540 can be formed of a colorless transparent polymer resin material, such as epoxy or silicone. The resin layer 540 can contain a fluorescent material for changing a wave length of the light from the light emitting device 520.

A plurality of the light emitting device packages in accordance with any one of the embodiments can be disposed on a substrate, and a light guide plate, a prism sheet, a diffusion sheet, and the like that are optical members can be disposed on a light path of the light emitting device package.

As another embodiment, a display device, an indicating device, or a lighting system can be produced, which includes the light emitting device or the light emitting device package described in the foregoing embodiments, and the lighting system can include, for an example, a lamp or a street light.

Figure 7:
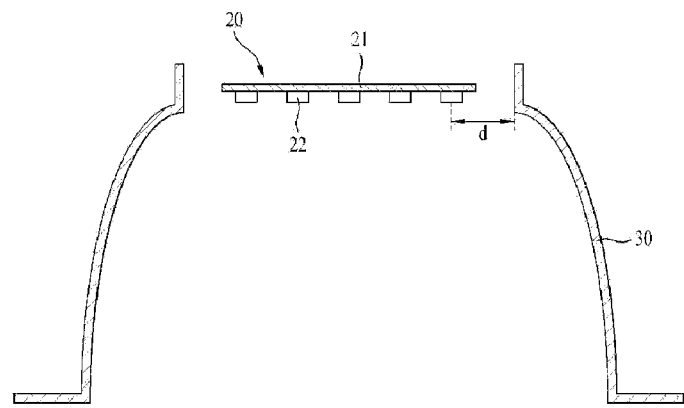
FIG. 7 illustrates a section of a lighting device having a light emitting module in accordance with an embodiment.

FIG. 7 illustrates a section of a lighting device having a light emitting module in accordance with an embodiment.

Referring to FIG. 7, the lighting device includes a light emitting module 20, and a light guide 30 for guiding a projection beam angle of the light from the light emitting module 20.

The light emitting module 20 can include at least one light emitting device 22 mounted to a PCB (printed circuit board) 21, and a plurality of the light emitting devices 22 can be disposed on the PCB 21 spaced from one another. The light emitting device 22 can be, for an example, an LED (Light Emitting diode).

The light guide 30 makes the light from the light emitting module 20 to converge such that the light is projected through an opening at a fixed beam angle, and can have an inside mirror surface. In this instance, the light emitting module 20 and the light guide can be mounted spaced a distance d away from each other.

As described before, the lighting device can be used as a lighting lamp for obtaining a light by integrating a plurality of the light emitting devices 22, particularly, as a downlight buried in a ceiling or wall of a building with an opening side of the light guide 30 exposed.

Figure 8:
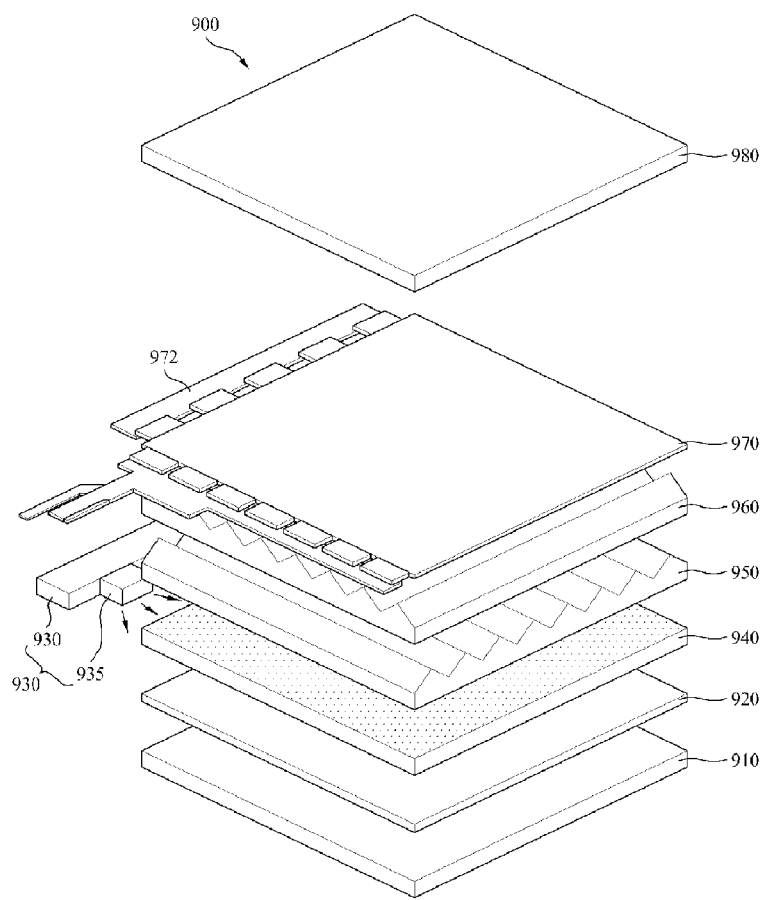
FIG. 8 illustrates a display device in accordance with an embodiment.

FIG. 8 illustrates a display device 900 having the light emitting device package in accordance with an embodiment.

Referring to FIG. 8, the display device 900 includes a bottom cover 910, a reflective plate 920 on the bottom cover 910, a light source module 930 for emitting a light, a light guide plate 940 disposed in front of the reflective plate 920 for guiding the light from the light source module 930 to a front of the display device, optical sheets including prism sheets 950 and 960 disposed in front of the light guide plate 940, a panel 970 disposed in front of the optical sheet 950 and 960, a picture signal forwarding circuit 972 connected to the panel 970 for supplying a picture signal to the panel 970, and a color filter 980 disposed in front of the panel 970. In this instance, the bottom cover 910, the reflective plate 920, the light source module 930, the light guide plate 940, and the optical sheets can construe a backlight unit.

The light source module 930 includes a light emitting device package 935 on a substrate 932. In this instance, the substrate 932 can be a PCB or the like, and the light emitting device package 935 can be one 500 suggested in the foregoing embodiment.

The bottom cover 910 can accommodate elements of the display device 900. And, the reflective plate 920 can be an individual element as shown in the drawing, or can be a coat of a material with a high reflectivity on a rear of the light guide plate 940 or on a front of the bottom cover 910.

In this instance, the reflective plate 920 can be formed of a material which has high reflectivity and can form a micronfilm, such as PET (PolyEthylene Terephtalate).

And, the light guide plate 930 scatters the light from the light emitting module to distribute the light throughout an entire screen of the liquid crystal display device. Therefore, the light guide plate 930 can be formed of PolyMethyl-MethAcrylate PMMA, PolyCarbonate PC, or PolyEthylene PE.

And, the first prism sheet 950 can be formed of a polymer having light transmissivity and elasticity on one side of a supporting film. The polymer can have a prism layer with a plurality of three dimensional structures formed thereon, repeatedly. In this instance, as shown, the plurality of patterns can be a stripe type with repetitive ridges and grooves.

And, a direction of the ridges and the grooves on one side of the second prism sheet 960 can be perpendicular to a direction of the ridges and the grooves on one side of the first prism sheet 950, for uniform distribution of the light from the light source module and the reflective sheet to an entire surface of the panel 970.

And, though not shown, each of the prism sheets can have a protective sheet provided thereon by providing a protective layer having light diffusing particles and a binder applied to both sides of the supporting film. And, the prism layer can be formed of a polymer material selected from a group including polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet can be disposed between the light guide plate 940 and the first prism sheet 950. The diffusion sheet can be formed of a material selected from a polyester group and a polycarbonate group, for widening a light projection angle to the maximum by refraction and scattering of the light from the backlight unit. And, the diffusion sheet can include a supporting layer having light diffuser contained therein, and a first layer and a second layer both without the light diffuser contained therein formed on a light forwarding surface (a first prism sheet direction) and a light incident surface (a reflective sheet direction), respectively.

In the embodiment, though the diffusion sheet, the first prism sheet 950 and the second prism sheet 960 construe the optical sheet, the optical sheet can be constructed of other combination, for an example, a microlens array, a combination of the diffusion sheet and the microlens array, a combination of one prism sheet and the microlens array, or so on.

As the panel 970, a liquid crystal panel can be applied, and besides the liquid crystal panel 960, other kind of display device which requires a light source can be applied. The panel 970 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are disposed regularly like crystal. By utilizing a property of the liquid crystals in which a molecular arrangement varies with an external electric field, a picture is displayed.

The liquid crystal panel used in the display device has an active matrix system, in which a transistor is used as a switch for controlling a voltage supplied to pixels. And, the panel 970 has the color filter 980 on a front for each of pixels to transmit only red, green and blue lights of the light from the panel 970, thereby displaying a picture.

As have been described, the light emitting device, and the light emitting device package of the embodiments can improve productivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A light emitting device comprising:
a light emitting structure including a second conductive type semiconductor layer, an active layer, and a first conductive type semiconductor layer;

a first protective layer disposed on a side of the light emitting structure, wherein the first protective layer overlaps with the first conductive type semiconductor layer in a vertical direction;

a second electrode layer disposed under the second conductive type semiconductor layer;

a first electrode layer passed through the second conductive type semiconductor layer and the active layer, and in contact with the first conductive type semiconductor layer; and an insulating layer disposed between the first electrode layer and the second conductive type semiconductor layer, and between the first electrode layer and the active layer.

2. The light emitting device as claimed in claim 1, wherein a top side of the first protective layer is in contact with the first conductive type semiconductor layer.

3. The light emitting device as claimed in claim 2, wherein the first protective layer covers sides of the second conductive type semiconductor layer, and the active layer.

4. The light emitting device as claimed in claim 3, wherein the first protective layer covers a portion of a side of the first conductive type semiconductor layer.

5. The light emitting device as claimed in claim 3, wherein the top side of the first protective layer is higher than a boundary between the active layer and the first conductive type semiconductor layer, and is in contact with the first conductive type semiconductor layer.

6. The light emitting device as claimed in claim 5, wherein the top side of the first protective layer is lower than a top side of the first conductive type semiconductor layer.

7. The light emitting device as claimed in claim 1, further comprising a second protective layer which covers sides of the first protective layer and the first conductive type semiconductor layer.

8. The light emitting device as claimed in claim 7, wherein the second protective layer is formed on a top side of the first conductive type semiconductor layer.

9. The light emitting device as claimed in claim 1, wherein the first protective layer includes any one of SiO2, SiOx, SiOxNy, Si3N4, and Al2O3.

10. The light emitting device as claimed in claim 1, wherein the first protective layer is in contact with an underside of the second conductive type semiconductor layer.

11. The light emitting device as claimed in claim 1, wherein the first electrode layer is disposed under the second electrode layer and passed through the second electrode layer, and the insulating layer is disposed between the first electrode layer and the second electrode layer.

12. A light emitting device package comprising:
a package body;
a light emitting device on the package body;
a first electrode layer and a second electrode layer mounted on the package body and connected to the light emitting device; and
a resin layer surrounding the light emitting device, wherein the light emitting device is claimed in claim 1.

13. A light emitting device comprising:
a light emitting structure including a second conductive type semiconductor layer, an active layer, and a first conductive type semiconductor layer;
a first protective layer disposed on a side of the light emitting structure,
wherein the side of the light emitting structure includes:
a first portion adjacent to a top surface of the light emitting structure,
a second portion adjacent to an underside bottom surface of the light emitting structure, and
a third portion which connects the first portion to the second portion,
wherein the first protective layer is disposed on the second portion;
a second electrode layer disposed under the second conductive type semiconductor layer;
a first electrode layer passed through the second conductive type semiconductor layer and the active layer, and in contact with the first conductive type semiconductor layer; and
an insulating layer disposed between the first electrode layer and the second conductive type semiconductor layer, and between the first electrode layer and the active layer.

14. The light emitting device as claimed in claim 13, wherein a step exists between the first portion and the second portion, and the first protective layer is in contact with the third portion.

15. The light emitting device as claimed in claim 13, wherein the first protective layer is in contact with an underside of the second conductive type semiconductor layer.

* * * * *